(12) United States Patent
Franco et al.

(10) Patent No.: US 7,457,987 B2
(45) Date of Patent: Nov. 25, 2008

(54) TEST VECTOR MANAGER, METHOD OF MANAGING TEST VECTORS AND A TEST TOOL EMPLOYING THE MANAGER AND THE METHOD

(75) Inventors: Antonio L. Franco, Naperville, IL (US); Bryan E. Peterson, Aurora, IL (US); Jose M. Miranda, Hamilton, NJ (US); Bradford G. Van Treuren, Lambertville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 448 days.

(21) Appl. No.: 11/371,710

(22) Filed: Mar. 9, 2006

(65) Prior Publication Data

US 2007/0214392 A1 Sep. 13, 2007

(51) Int. Cl.
*G06F 11/00* (2006.01)
(52) U.S. Cl. ........................................................ 714/32
(58) Field of Classification Search ............. 714/30–32, 714/27, 43, 48, 56, 726, 727
See application file for complete search history.

(56) References Cited

U.S. PATENT DOCUMENTS

| | | | | |
|---|---|---|---|---|
| 5,423,050 A * | 6/1995 | Taylor et al. | ................... | 714/31 |
| 5,841,788 A * | 11/1998 | Ke | .............................. | 714/726 |
| 7,149,943 B2 * | 12/2006 | Van Treuren et al. | ........ | 714/727 |
| 2003/0061020 A1 * | 3/2003 | Michael | ....................... | 703/28 |
| 2005/0154949 A1 | 7/2005 | Bradford et al. | | |

\* cited by examiner

*Primary Examiner*—Nadeem Iqbal

(57) ABSTRACT

The present invention provides a test vector manager for use with a unit under test (UUT). In one embodiment, the test vector manager includes a gateway device, coupled to the UUT, configured to provide a testing pathway for the UUT to coordinate test requests and responses for a backplane multi-drop test bus. The test vector manager also includes a test memory, coupled to the gateway device, configured to retrieve version-specific test vectors, which are resident on the UUT and correspond to the test requests. The test vector manager further includes a chain configuration logic unit, coupled to the test memory, configured to return the version-specific test vectors to the backplane multi-drop test bus employing the testing pathway. Alternatively, the test vector manager is further configured to connect the backplane multi-drop test bus to local UUT test bus and scan chain interfaces for tests using the version-specific test vectors.

26 Claims, 2 Drawing Sheets

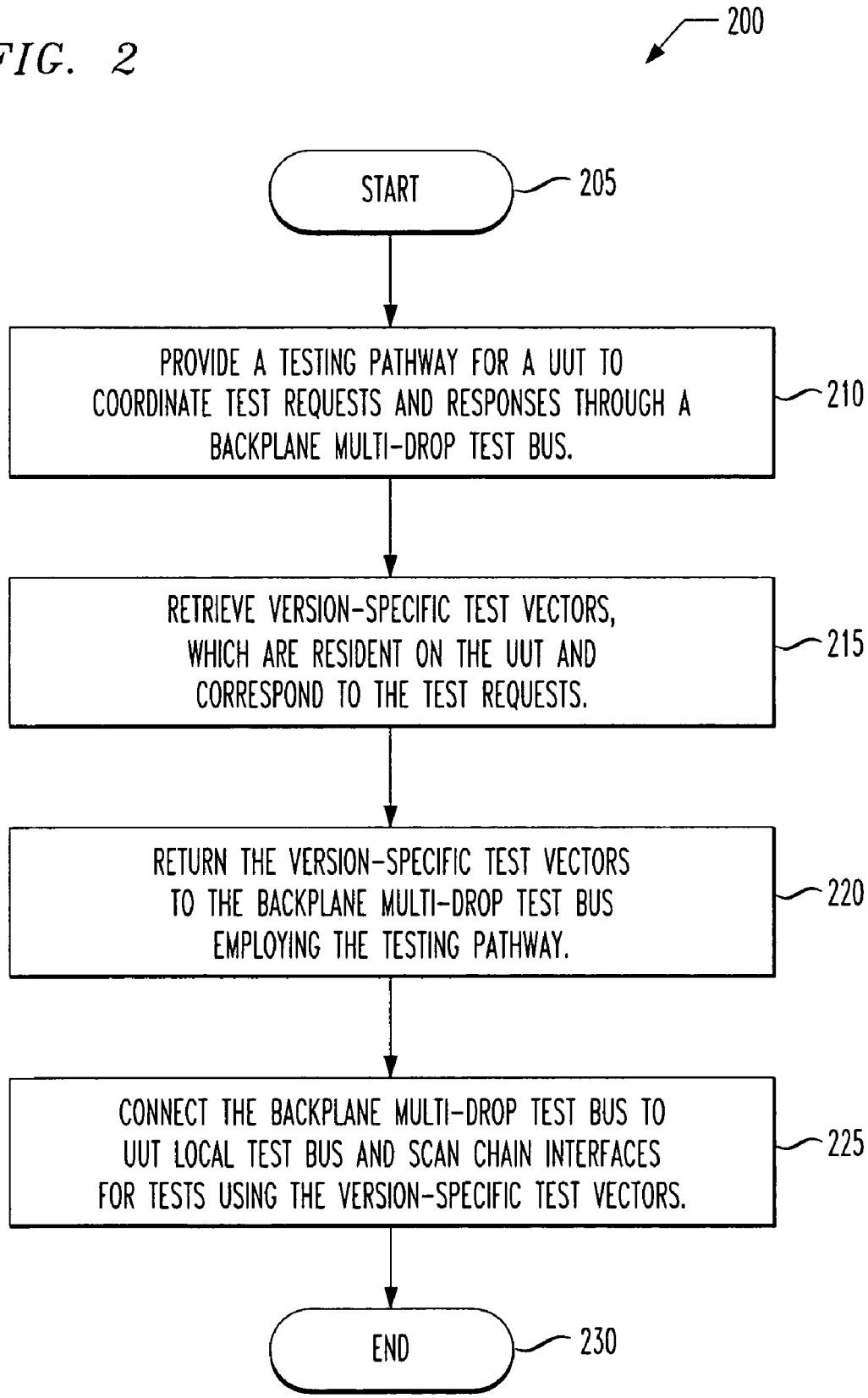

TEST VECTOR MANAGER, METHOD OF MANAGING TEST VECTORS AND A TEST TOOL EMPLOYING THE MANAGER AND THE METHOD

TECHNICAL FIELD OF THE INVENTION

The present invention is directed, in general, to system hardware testing and debugging and, more specifically, to a test vector manager, a method of managing test vectors and a test tool employing the manager or the method.

BACKGROUND OF THE INVENTION

Highly available and reliable fault-tolerant systems, such as those used in telecommunications, web servers and highly-available storage systems rely on built-in diagnostics to automatically detect actual or impending failures. Once a problem is identified, the system can respond in providing a resolution or alternate path to prevent an outage of service to the customer. Traditionally, software-based functional tests were used to provide diagnostics that were built into a system and were usually provided by highly skilled programmers, who understood the internal workings of the circuits. These diagnostic systems require problem resolution granularity to the smallest field replaceable unit (FRU) that may be isolated for recovery. In the past, these FRUs were typically a single circuit board or a set of circuit boards.

Due to the increasing miniaturization of today, a single circuit board may contain specialized ASIC and programmable gate array devices. Each of these embody a level of functionality that would have required one or more complete circuit boards to implement, in the past. Further, many single circuit boards today contain multiple such devices thereby providing what an entire system provided in the past. Scaling the traditional approach for system diagnostics required for past systems to the complexity of current and projected future systems becomes increasingly problematic, especially when attempting to provide a product under a required market window constraint.

Boundary scan (JTAG) techniques and components employing the IEEE 1149.1 standard governing design, registers, protocols and testing of boundary scan components are generally used today. System level boundary scan testing, using a multi-drop architecture and a simplex or duplex test controller, is able to test any circuit board (i.e., a unit under test (UUT)) that is connected to a backplane. However, the issue of test vector management provides an ongoing difficulty. For each slot in a backplane, there may be a variety of versions of a circuit board or a multiplicity of specialized boards. Boundary scan tests are based on the specific structure of the circuit design. Thus, a test developed for one version of circuit board will not usually work properly for another version of the design. Therefore, a major testing difficulty is one of correctly selecting the appropriate test vectors, required by the test controller, for application to the UUT circuit board currently located in the test slot.

Many methods have been used to manage test vector selection including obtaining the vectors from the UUT by using existing application side system data busses, specialized state synchronization busses, maps of UUT ID codes to vector files that are either resident or downloaded to the test controller, and dedicated configurations per backplane slot. The retrieval of data using the existing application side system data busses tends to use more than fifty percent of the UUT circuits to perform the operation. Thus, the advantage of performing the Boundary Scan test is low and not cost effective since most of the circuit has already been tested by the retrieval operation. This also applies to the use of synchronization busses. Maps of ID codes to test data require services to be operational on the UUT to obtain the code, as well as a large data store on the test controller or download server for all possible versions. This latter approach also suffers from difficulties in managing version upgrades in the field, when new circuit boards are integrated into an existing system.

Accordingly, what is needed in the art is an enhanced way to ensure that the correct version of test vectors is applied to a specific UUT.

SUMMARY OF THE INVENTION

To address the above-discussed deficiencies of the prior art, the present invention provides a test vector manager for use with a unit under test (UUT). In one embodiment, the test vector manager includes a gateway device coupled to the UUT and configured to provide a testing pathway for the UUT to coordinate test requests and responses for a backplane multi-drop test bus. The test vector manager also includes a test memory coupled to the gateway device and configured to retrieve version-specific test vectors, which are resident on the UUT and correspond to the test requests. The test vector manager further includes a chain configuration logic unit coupled to the test memory and configured to return the version-specific test vectors to the backplane multi-drop test bus employing the testing pathway. In an alternative embodiment, the test vector manager is further configured to connect the backplane multi-drop test bus to local UUT test bus and scan chain interfaces for tests using the version-specific test vectors.

In another aspect, the present invention provides a method of managing test vectors for a unit under test (UUT). The method includes providing a testing pathway for the UUT to coordinate test requests and responses through a backplane multi-drop test bus and retrieving version-specific test vectors, which are resident on the UUT and correspond to the test requests. The method also includes returning the version-specific test vectors to the backplane multi-drop test bus employing the testing pathway.

The present invention also provides, in yet another aspect, a test tool. The test tool includes a system test controller, a backplane multi-drop test bus coupled to the system test controller and a unit under test (UUT) coupled to the backplane multi-drop test bus. The test tool also includes a test vector manager, coupled to the UUT, having a gateway device that provides a testing pathway for the UUT to coordinate test requests and responses with the system test controller through the backplane multi-drop test bus. The test vector manager also has a test memory, coupled to the gateway device, that retrieves version-specific test vectors, which are resident on the UUT and correspond to the test requests. The test vector manager further has a chain configuration logic unit, coupled to the test memory, that returns the version-specific test vectors to the backplane multi-drop test bus employing the testing pathway. The test tool further includes a UUT local test structure, coupled to the test vector manager, that provides local UUT test bus and local scan chain interfaces for tests using the version-specific test vectors.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIG. 2 illustrates a flow diagram of a method of managing test vectors carried out in accordance with the principles of the present invention.

DETAILED DESCRIPTION

Figure 1:
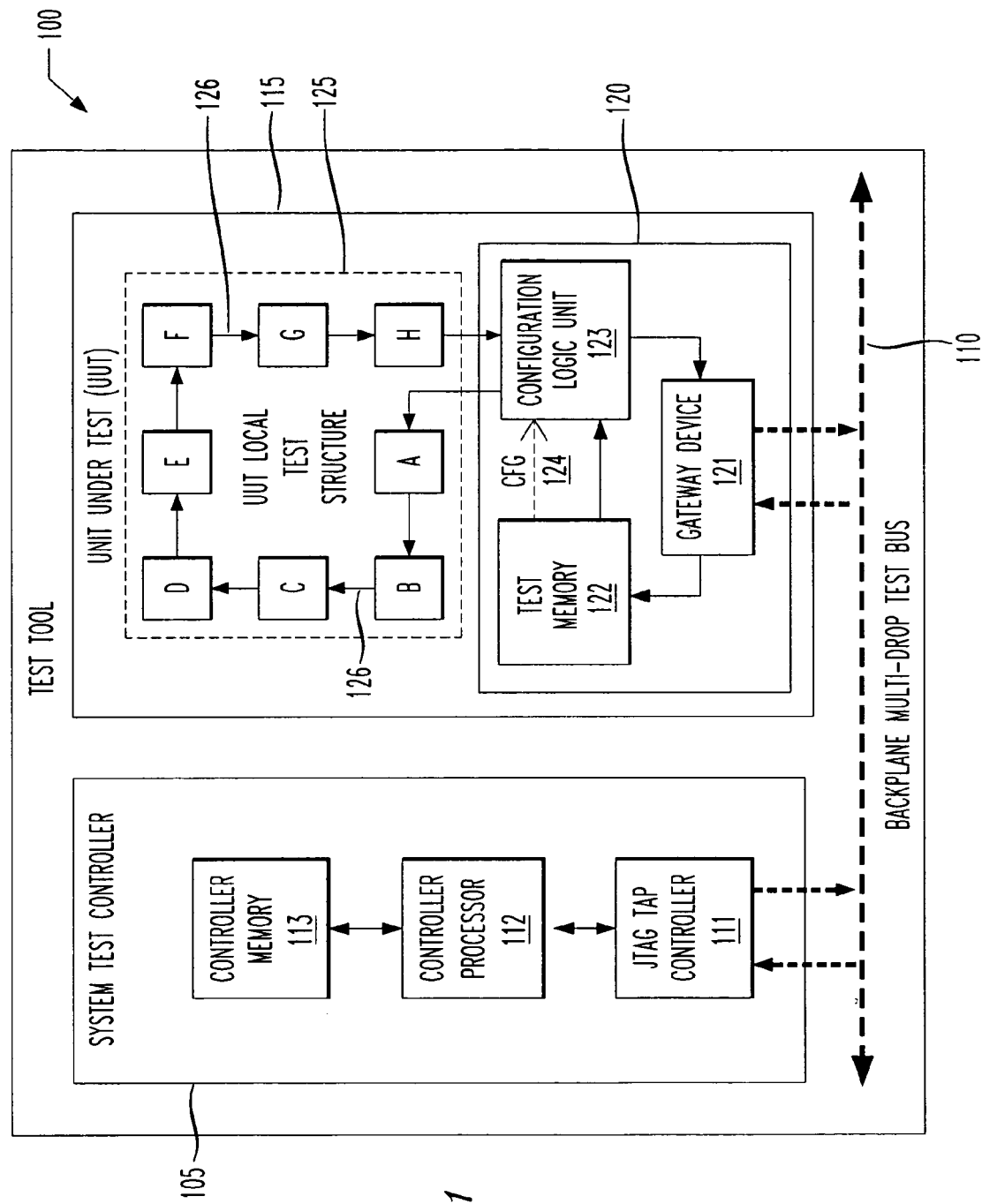
FIG. 1 illustrates a system diagram of a test tool constructed in accordance with the principles of the present invention.

Referring initially to FIG. 1, illustrated is a system diagram of a test tool, generally designated 100, constructed in accordance with the principles of the present invention. The test tool 100 includes a system test controller 105, a backplane multi-drop test bus 110 and a unit under test (UUT) 115. The system test controller 105 includes a JTAG test access port (TAP) controller 111, a controller processor 112 and a controller memory 113. The UUT 115 includes a test vector manager 120 and a UUT local test structure 125. The test vector manager 120 includes a gateway device 121, a test memory 122 and a configuration logic unit 123. The UUT local test structure 125 includes a local test bus 126 that interconnects a plurality of local scan chain interfaces 125A-125H.

The system test controller 105 is coupled to the UUT 115 through the backplane multi-drop test bus 110. The test vector manager 120 is located on the UUT 115 along with the UUT local test structure 125, as shown. The gateway device 121 provides a testing pathway for the UUT 115 to coordinate test requests and responses with the system test controller 105 through the backplane multi-drop test bus 110. The test memory 122 is coupled to the gateway device 121 and retrieves version-specific test vectors, which are resident on the UUT 115 and correspond specifically to the version of the UUT 115 being tested. The chain configuration logic unit 123 is coupled to the test memory 121 and returns the version-specific test vectors to the backplane multi-drop test bus 110 employing the testing pathway. Alternatively, the chain configuration logic unit 123 may also connect the backplane multi-drop test bus 110 to the local UUT test bus 126 and the plurality of local scan chain interfaces 125A-125H for testing of specific circuits on the UUT 115 using the version-specific test vectors.

In the illustrated embodiment, pertinent test vectors are stored on the UUT 115 wherein access to the required test data is accommodated through at least three functional devices on the UUT 115 that are part of a normal JTAG test infrastructure. This provides the ability to access the correct test data for the UUT 115 even though the UUT 115 might not be operating properly. The test tool 100 employs the IEEE 1149.1 standard boundary scan technology (JTAG) along with multi-drop extensions to the IEEE 1149.1 specification to provide a gateway to the UUT 115 from the backplane multi-drop test bus 110. Additionally, the test memory 122 is an IEEE 1149.1 compliant programmable read-only memory (PROM) device, and the configuration logic unit 123 employs a complex programmable logic device (cPLD) to provide chain selection logic locally to the UUT 115, in the illustrated embodiment. In an alternative embodiment, the test memory 122 may employ a flash memory that is IEEE 1149.1 compliant.

The system test controller 105 is able to obtain data from the test memory 122 on the UUT 115 using a standard 1149.1 protocol to access specialized internal registers in the test memory 122 for reading or writing data. The test memory 122 also contains a specialized instruction (i.e., a configuration pulse signal CFG 124) to trigger a state change on a pin of the test memory 122 that is used normally for causing an associated Field Programmable Gate Array (FPGA) to reload its program from the test memory 122. In this embodiment, however, the configuration pulse signal CFG 124 is used to trigger the chain selection logic unit 123 to include the UUT local test structure 125 into a test bus configuration for complete testing of the UUT 115 over the backplane multi-drop test bus 110.

Programming of the test memory 122 may be performed using the same mechanism as would be used to program a configuration PROM for a programmable device. Thus, existing IEEE 1149.1 protocol-based languages support the programming of the contents of the test memory 122 with the test data required. To package the test data into a programming packet for the test memory 122, the software tools supplied by the manufacturer of the particular PROM employed may be used. This allows construction of a test file in the manufacturer's data format that consists of the version-specific test vectors along with any other information required to be resident on the UUT 115. The manufacturer's tools produce the IEEE 1149.1 programming sequence for the device.

Tooling used to migrate the programming sequence to the embedded boundary scan testing environment may be used to pad the data bits required for other devices in the chain around the JTAG test memory 122. In the implementation shown in FIG. 1, there are no other IEEE 1149.1 devices in the chain so the version-specific test data can be used to program the JTAG test memory 122. A key point is that the process is the same as for existing devices such as for programming a configuration PROM employed for a programmable device. Instead of using the program pattern for the programmable device, the version-specific test vectors are used.

To be able to apply the extracted set of tests to the UUT 115, the local test bus 126 of the UUT 115 has to be enabled and bridged into the backplane multi-drop test bus 110. To accomplish this, the CFG signal 124 on the test memory 122, which is normally employed to trigger a reprogramming of an attached programmable device, is used to inform the chain configuration logic unit 123 that the local test bus 126 is to be stitched into the testing pathway of the gateway device 121. This is accomplished following the extraction of the test data from the test memory 122 and prior to applying the test data for the UUT 115. The CFG signal 124 is controlled through a specific boundary scan register in the test memory 122. A specific value, written to this register, causes the CFG signal 124 to transition thereby signaling the configuration logic unit 123 to change the local boundary scan chain configuration of the UUT local test structure 125.

The controller processor 112 applies software programs, which reside in the system test controller memory 113. These programs are used to interpret and apply high-level test directives and test operations (TestSteps). One such directive is to apply the appropriate gateway selection protocol to the gateway device 121 thereby bridging the backplane multi-drop test bus 110 to the IEEE 1149.1 compliant UUT local test structure 125 on the UUT 115. In addition to standard test software, specialized software objects may be added to enhance the test system feature set without changing the test language used by the test engineers to develop the tests. One of these specialized software objects employs a specialized TestStep that is able to apply boundary scan vectors to the UUT 115 and pass back selected data from vectors to the controller memory 113 for other software running on the controller processor 112 to process independently.

Through this latter mechanism, the software is able to apply commands to the test memory 122 to retrieve data from its contents using a device feature that is normally employed to verify programming of a configuration device. Thus, this TestStep is able to read data to support the reading of the version-specific test vectors from the test memory 122 and place the data into the controller memory 113. This allows the client program of the test software to access the contents as a new set of test directives and operations to apply through the JTAG TAP Controller 111 interface and software test system. This additional TestStep enables the separation of the test program from the test data. Examples of such applications are described in U.S. Patent Application Publication 2005/0154949 titled "System for Flexible Embedded Boundary Scan Testing" by Bradford G. Van Treuren, et al, published on Jul. 14, 2005, which is incorporated by reference herein in its entirety.

Turning now to FIG. 2, illustrated is a flow diagram of a method of managing test vectors, generally designated 200, carried out in accordance with the principles of the present invention. The method 200 is for use with a UUT and starts in a step 205. Then, in a step 210, a testing pathway for the UUT is provided to coordinate test requests and responses through a backplane multi-drop test bus. The testing pathway allows a-test structure local to the UUT, which provides a local test bus along with local scan chain interfaces and forms a local boundary scan chain configuration, to be connected to the backplane multi-drop test bus.

Then, in a step 215, version-specific test vectors are retrieved, which are resident on the UUT and correspond to the test requests. Retrieval of the version-specific test vectors is accomplished as part of a boundary scan (JTAG) test infrastructure and independently of either UUT version or UUT type. Additionally, the version-specific test vectors may be obtained from the UUT without impacting its normal operation or without application logic of the UUT being either operational or functional. In one embodiment, retrieving the version-specific test vectors, in the step 215, is compliant with the IEEE 1149.1 standard and employs a memory element that is either a programmable read-only memory (PROM) or a flash memory.

The version-specific test vectors are returned to the backplane multi-drop test bus employing the testing pathway, in a step 220. Additionally, the backplane multi-drop test bus is connected to UUT local test bus and scan chain interfaces for tests using the version-specific test vectors in a step 225. In one embodiment, a complex programmable logic device (cPLD) is employed by the version-specific test vectors to configure the UUT for testing and the testing pathway for returning the test responses to the backplane multi-drop test bus. Additionally, the version-specific test vectors are provided while employing a configuration pulse signal to change the local boundary scan chain configuration. The method 200 ends in a step 230.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing a test vector manager, a method of managing test vectors and a test tool employing the manager or the method have been presented. Advantages include incorporating version-specific test vectors on the UUT and providing a means to extract the information from the targeted UUT directly. This solution leverages multi-drop test architecture while providing the ability to support JTAG-based vector management on the UUT. To accommodate these features, the gateway device and the test memory are employed on the UUT circuit to provide both the multi-drop interface and JTAG-based vector management.

In embodiments of the present invention, local chain management and board-centric tests are supported as well as the new multi-drop access to the UUT local test structure for testing and upgrades. Additionally, this new approach requires minimal UUT functionality and provides the ability to access the correct test data for the UUT without affecting its operation, even when the UUT is not operating properly. The configuration of the UUTs may be substantially the same, so version and feature set do not impact the implementation or the process of retrieving the version-specific test data from the UUT.

Benefits include ease of test vector management, increased scan coverage and low backplane signal usage. Since the test vectors are stored on and therefore follow the UUT, the only information the system test controller needs to know is how to access the gateway and test memory, which is the same for all client UUTs. This provides great benefit when installing a newer card into an older system where a software upgrade may be avoided that would interrupt a high availability system. Greater in-system diagnostic boundary-scan coverage of the UUT is possible since very little UUT resources are needed to run the test from the system test controller. Additional boundary-scan coverage of the backplane interfaces to the controller card and even to other clients is possible. The use of the JTAG multi-drop test bus for both control and data paths eliminates dependency on other maintenance busses. As few as five backplane signals may be needed for the JTAG multi-drop test bus.

Although the present invention has been described in detail, those skilled in the art should understand that they can make various changes, substitutions and alterations herein without departing from the spirit and scope of the invention in its broadest form.

What is claimed is:

1. A test vector manager for use with a unit under test (UUT), comprising:
    a gateway device coupled to the UUT and configured to provide a testing pathway for the UUT to coordinate test requests and responses for a backplane multi-drop test bus;
    a test memory coupled to the gateway device and configured to retrieve version-specific test vectors, which are resident on the UUT and correspond to the test requests; and
    a chain configuration logic unit coupled to the test memory and configured to return the version-specific test vectors to the backplane multi-drop test bus employing the testing pathway.

2. The manager as recited in claim 1 wherein the chain configuration logic unit is further configured to connect the backplane multi-drop test bus to local UUT test bus and scan chain interfaces for tests using the version-specific test vectors.

3. The manager as recited in claim 1 wherein the version-specific test vectors are obtained from the UUT without application logic of the UUT being operational or functional.

4. The manager as recited in claim 1 wherein the version-specific test vectors are obtained from the UUT without impacting normal operation of the UUT.

5. The manager as recited in claim 1 wherein retrieval of the version-specific test vectors is independent of either UUT version or type.

6. The manager as recited in claim 1 wherein retrieval of the version-specific test vectors is accomplished as part of a boundary scan test infrastructure.

7. The manager as recited in claim 1 wherein the test memory is configured to be compliant with the IEEE 1149.1 standard and employ a memory element selected from the group consisting of:
   a programmable read-only memory (PROM); and
   a flash memory.

8. The manager as recited in claim 1 wherein the test memory is configured to provide a configuration pulse signal to the chain configuration logic thereby changing a local boundary scan chain configuration.

9. The manager as recited in claim 1 wherein the chain configuration logic unit is configured to employ a complex programmable logic device (cPLD).

10. A method of managing test vectors for a unit under test (UUT); comprising:
    providing a testing pathway for the UUT to coordinate test requests and responses through a backplane multi-drop test bus;
    retrieving version-specific test vectors, which are resident on the UUT and correspond to the test requests; and
    returning the version-specific test vectors to the backplane multi-drop test bus employing the testing pathway.

11. The method as recited in claim 10 further comprising connecting the backplane multi-drop test bus to local UUT test bus and scan chain interfaces for tests using the version-specific test vectors.

12. The method as recited in claim 10 wherein the version-specific test vectors are obtained from the UUT without application logic of the UUT being operational or functional.

13. The method as recited in claim 10 wherein the version-specific test vectors are obtained from the UUT without impacting normal operation of the UUT.

14. The method as recited in claim 10 wherein retrieval of the version-specific test vectors is independent of either UUT version or type.

15. The method as recited in claim 10 wherein retrieval of the version-specific test vectors is accomplished as part of a boundary scan test infrastructure.

16. The method as recited in claim 10 wherein retrieving the version-specific test vectors is compliant with the IEEE 1149.1 standard and employs a memory element selected from the group consisting of:
    a programmable read-only memory (PROM); and
    a flash memory.

17. The method as recited in claim 10 wherein retrieving the version-specific test vectors employs a configuration pulse signal to change a local boundary scan chain configuration.

18. The method as recited in claim 10 wherein returning the version-specific test vectors employs a complex programmable logic device (cPLD).

19. A test tool, comprising:
    a system test controller;
    a backplane multi-drop test bus coupled to the system test controller;
    a unit under test (UUT) coupled to the backplane multi-drop test bus;
    a test vector manager, coupled to the UUT, including:
        a gateway device that provides a testing pathway for the UUT to coordinate test requests and responses with the system test controller through the backplane multi-drop test bus,
        a test memory, coupled to the gateway device, that retrieves version-specific test vectors, which are resident on the UUT and correspond to the test requests, and
        a chain configuration logic unit, coupled to the test memory, that returns the version-specific test vectors to the backplane multi-drop test bus employing the testing pathway; and
    a UUT local test structure, coupled to the test vector manager, that provides local UUT test bus and scan chain interfaces for tests using the version-specific test vectors.

20. The test tool as recited in claim 19 wherein the version-specific test vectors are obtained from the UUT without application logic of the UUT being operational or functional.

21. The test tool as recited in claim 19 wherein the version-specific test vectors are obtained from the UUT without impacting normal operation of the UUT.

22. The test tool as recited in claim 19 wherein retrieval of the version-specific test vectors is independent of either UUT version or type.

23. The test tool as recited in claim 19 wherein retrieval of the version-specific test vectors is accomplished as part of a boundary scan test infrastructure.

24. The test tool as recited in claim 19 wherein the test memory is compliant with the IEEE 1149.1 standard and employs a memory element selected from the group consisting of:
    a programmable read-only memory (PROM); and
    a flash memory.

25. The test tool as recited in claim 19 wherein the test memory provides a configuration pulse signal to the chain configuration logic thereby changing a local boundary scan chain configuration.

26. The test tool as recited in claim 19 wherein the chain configuration logic unit is configured to employ a complex programmable logic device (cPLD).

* * * * *